US012801034B2

(12) United States Patent
Ishida

(10) Patent No.: US 12,801,034 B2
(45) Date of Patent: Nov. 17, 2026

(54) DETERMINATION OF A RECIPE FOR A FORMING PROCESS BASED ON PITCH RATIO BETWEEN DROPLETS AND COMPOSITION DEFECTS

(71) Applicant: CANON KABUSHIKI KAISHA, Tokyo (JP)

(72) Inventor: Shingo Ishida, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 435 days.

(21) Appl. No.: 18/510,971

(22) Filed: Nov. 16, 2023

(65) Prior Publication Data

US 2024/0168389 A1 May 23, 2024

(30) Foreign Application Priority Data

Nov. 21, 2022 (JP) ................................ 2022-185751

(51) Int. Cl.
*G03F 7/00* (2006.01)
*H10P 72/00* (2026.01)

(52) U.S. Cl.
CPC .......... *G03F 7/7065* (2013.01); *G03F 7/0002* (2013.01); *H10P 72/0448* (2026.01)

(58) Field of Classification Search
CPC ... G03F 7/7065; G03F 7/0002; H10P 72/0448
See application file for complete search history.

(56) References Cited

U.S. PATENT DOCUMENTS 8,973,494 B2 3/2015 Hatano et al.
2013/0213930 A1 8/2013 Wakamatsu et al.
2014/0131313 A1* 5/2014 Wakamatsu .......... G03F 7/0002 703/2
2017/0285464 A1* 10/2017 Ito ........................ C09D 133/06
(Continued)

FOREIGN PATENT DOCUMENTS

JP 2011161711 A 8/2011
JP 2011228619 A 11/2011
JP 2012204382 A 10/2012
(Continued)

OTHER PUBLICATIONS

Office Action issued in Taiwanese Application No. 112142865 dated Oct. 20, 2025.

*Primary Examiner* — Rami R Okasha
(74) *Attorney, Agent, or Firm* — ROSSI, KIMMS & McDOWELL LLP

(57) ABSTRACT

The present invention provides a determination method of determining a recipe for arranging a composition as a plurality of droplets on a substrate in a forming process of forming the composition on the substrate using a mold, comprising: setting a grid for defining a first pitch as a pitch in a first direction between the droplets and a second pitch as a pitch in a second direction between the droplets, the second direction intersecting the first direction; and determining the recipe based on the grid, wherein the grid is set, based on information representing a relationship between a pitch ratio as a ratio of the first pitch and the second pitch and the number of defects occurring in the composition in the forming process, so that the number of defects is smaller than a predetermined value.

16 Claims, 9 Drawing Sheets

(56) References Cited

U.S. PATENT DOCUMENTS

2018/0329315 A1* 11/2018 Hirano .................. G03F 9/7042

FOREIGN PATENT DOCUMENTS

| | | | |
|---|---|---|---|
| JP | 2017163040 | A | 9/2017 |
| JP | 2020043338 | A | 3/2020 |
| KR | 20180067416 | A | 6/2018 |
| KR | 1020190132253 | A | 11/2019 |
| KR | 20200029366 | A | 3/2020 |
| KR | 20210082078 | A | 7/2021 |
| KR | 1020220139803 | A | 10/2022 |
| WO | 2011122702 | A1 | 10/2011 |
| WO | 2013187349 | A1 | 12/2013 |

* cited by examiner

DETERMINATION OF A RECIPE FOR A FORMING PROCESS BASED ON PITCH RATIO BETWEEN DROPLETS AND COMPOSITION DEFECTS

BACKGROUND OF THE INVENTION

Field of the Invention

The present invention relates to a determination method, a forming method, an article manufacturing method, a storage medium, an information processing apparatus, and a forming apparatus.

Description of the Related Art

There is known a forming technique of forming a composition on a substrate by bringing the composition arranged as a plurality of droplets on the substrate and a mold into contact with each other. Such a forming technique is applicable to an imprint technique and a planarization technique. The imprint technique can use a mold including a pattern with concave and convex portions to transfer the pattern of the mold to a composition on a substrate by curing the composition in a state in which the composition on the substrate and the mold are in contact with each other. The planarization technique can use a mold having a flat surface to form a film of a composition having a flat upper surface on a substrate by curing the composition in a state in which the composition on the substrate and the mold are in contact with each other.

In the imprint technique and the planarization technique, when the composition arranged as the plurality of droplets on the substrate and the mold are brought into contact with each other, bubbles may remain between the substrate and the mold (that is, in the composition on the substrate). If the composition is cured with the bubbles having entered in the composition, defects (unfilled defects) may occur at positions where the bubbles exist. In addition, the bubbles may be reduced with a lapse of time but if reduction of the bubbles is awaited, it may become disadvantageous in terms of the productivity (throughput). Therefore, in the forming technique, to reduce defects and obtain high productivity, that is, to accurately and efficiently form the composition on the substrate using the mold, it is desirable to arrange the composition as a plurality of droplets on the substrate.

Japanese Patent Laid-Open No. 2011-161711 discloses a method of decreasing the spacing between droplets of an imprint material by volatilizing a transfer material dropped onto a substrate to decrease the volume, and then shortening the time taken to fill a concave portion of a template with the transfer material. However, in the method described in Japanese Patent Laid-Open No. 2011-161711, it takes time to volatilize the transfer material dropped onto the substrate, and thus the productivity may be insufficient.

SUMMARY OF THE INVENTION

The present invention provides, for example, a technique advantageous in accurately and efficiently forming a composition on a substrate using a mold.

According to one aspect of the present invention, there is provided a determination method of determining a recipe for arranging a composition as a plurality of droplets on a substrate in a forming process of forming the composition on the substrate using a mold, comprising: setting a grid for defining a first pitch as a pitch in a first direction between the droplets and a second pitch as a pitch in a second direction between the droplets, the second direction intersecting the first direction; and determining the recipe based on the grid, wherein the grid is set, based on information representing a relationship between a pitch ratio as a ratio of the first pitch and the second pitch and the number of defects occurring in the composition in the forming process, so that the number of defects is smaller than a predetermined value.

Further features of the present invention will become apparent from the following description of exemplary embodiments with reference to the attached drawings.

DESCRIPTION OF THE EMBODIMENTS

Figure 1:
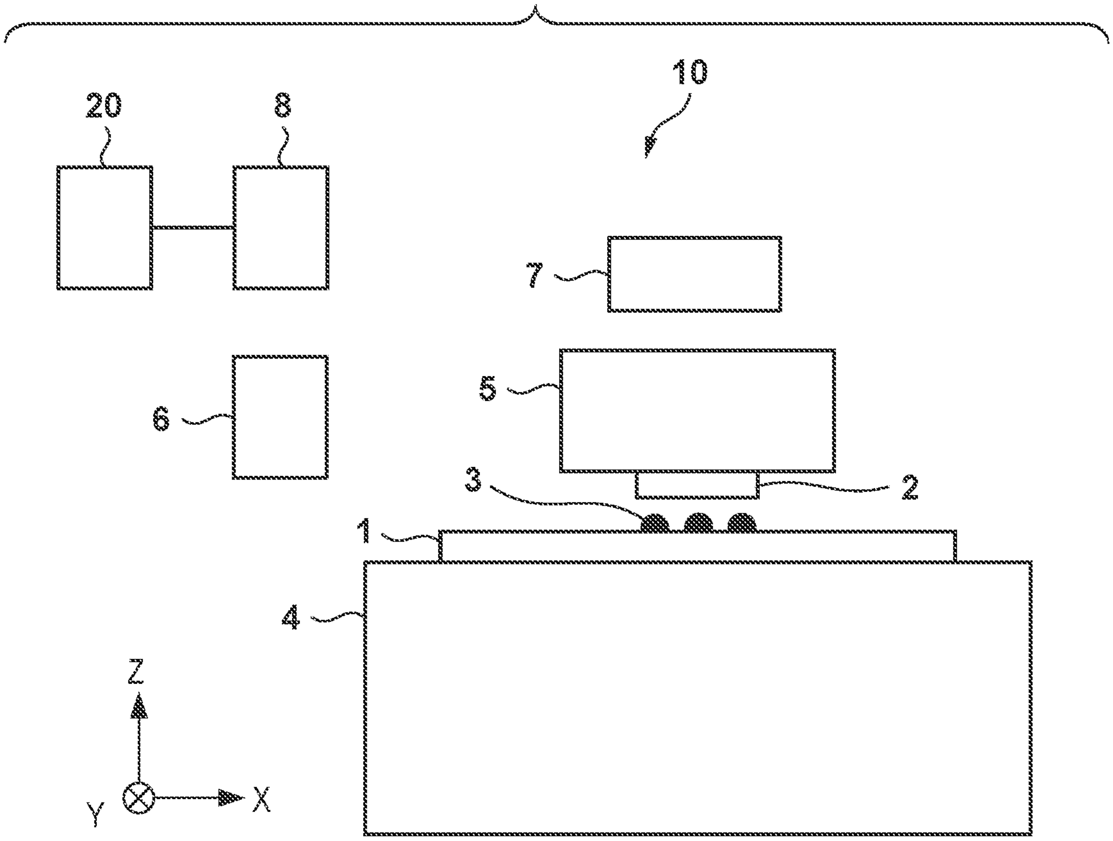
FIG. 1 is a view schematically showing the arrangement of an imprint apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

In the specification and the accompanying drawings, directions will be indicated on an XYZ coordinate system in which directions parallel to the surface of a substrate are defined as the X-Y plane, unless otherwise specified. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes.

First Embodiment

The first embodiment of the present invention will be described. A forming apparatus is an apparatus that performs a forming process of forming a curable composition (to be sometimes simply referred to as a "composition" hereinafter) by pressing a mold against the composition on a substrate. The forming process can include a supply step (arrangement step) of discretely supplying (arranging) droplets of the composition onto the substrate, and a contact step of bringing the composition supplied onto the substrate and the mold into contact with each other. The forming process can further include a curing step of curing the composition in a state in which the composition and the mold are in contact with each other, and a separation step of separating the mold from the cured composition.

Examples of the forming apparatus are an imprint apparatus and a planarization apparatus. The imprint apparatus is an apparatus that brings a mold including a pattern having concave and convex portions into contact with a composition (imprint material) on a substrate to form (transfer) the pattern on the composition. The forming process performed by the imprint apparatus will sometimes be referred to as an imprint process hereinafter. The planarization apparatus is an apparatus that planarizes the surface of a composition by bringing a mold having a flat surface into contact with the composition on a substrate. The forming process performed by the planarization apparatus will sometimes be referred to as a planarization process hereinafter. In this embodiment, the imprint apparatus will be exemplified as the forming apparatus but arrangements/processes to be described below can also be applied to the planarization apparatus.

FIG. 1 is a view schematically showing the arrangement of an imprint apparatus 10 according to this embodiment. The imprint apparatus 10 is a lithography apparatus adopted for a manufacturing step (lithography step) of a semiconductor device, a magnetic storage medium, a liquid crystal display device, or the like. The imprint apparatus 10 brings a mold 2 and an imprint material 3 (curable composition) supplied onto a substrate 1 into contact with each other, and providing curing energy to the imprint material 3, thereby performing an imprint process of forming, on the substrate, a pattern of a cured product to which the pattern having concave and convex portions of the mold 2 has been transferred. Note that the mold 2 will sometimes be referred to as a template or an original.

As the imprint material, a curable composition (to be also referred to as a resin in an uncured state hereinafter) to be cured by receiving curing energy is used. As the curing energy, electromagnetic waves, heat, or the like can be used. As the electromagnetic waves, light such as infrared light, visible light, or ultraviolet light selected from the wavelength range of 10 nm (inclusive) to 1 mm (inclusive) can be used. The curable composition can be a composition cured by light irradiation or heating. Among these, the photocurable composition cured by light irradiation contains at least a polymerizable compound and a photopolymerization initiator, and may contain a nonpolymerizable compound or a solvent, as needed. The nonpolymerizable compound is at least one type of material selected from a group consisting of a sensitizer, a hydrogen donor, an internal mold release agent, a surfactant, an antioxidant, a polymer component, and the like. The imprint material may be arranged on the substrate in the form of droplets or in the form of an island or film formed by connecting a plurality of droplets using a liquid injection head. The viscosity (the viscosity at 25° C.) of the imprint material can be, for example, 1 mPa·s (inclusive) to 100 mPa·s (inclusive).

As the material of the substrate 1, for example, glass, a ceramic, a metal, a semiconductor, a resin, or the like can be used. A member made of a material different from the substrate may be provided on the surface of the substrate, as needed. The substrate is, for example, a silicon wafer, a compound semiconductor wafer, or silica glass. Alternatively, the substrate may be a glass substrate for manufacturing a replica mold from a master mold by an imprint process.

The imprint apparatus 10 shown in FIG. 1 adopts a photo-curing method of curing an imprint material by light irradiation. The imprint apparatus 10 can include a substrate stage 4, a mold holding unit 5, a supply unit 6, a curing unit 7, and a control unit 8.

The substrate stage 4 holds the substrate 1 by drawing or attracting it by a vacuum suction force or an electrostatic force. The substrate stage 4 can move within the X-Y plane. When bringing the mold 2 and the imprint material 3 on the substrate 1 into contact with each other, the position of the substrate stage 4 is adjusted, and thus the position of the mold 2 and the position of the substrate 1 are matched. An actuator applicable to the substrate stage 4 includes, for example, a linear motor and an air cylinder. The substrate stage 4 may be configured to move the substrate 1 not only in the X direction and the Y direction but also in the Z direction. Furthermore, the substrate stage 4 may include a tilt mechanism for adjusting the position of the substrate 1 in the θZ direction and the tilt of the substrate 1 with respect to the X-Y plane.

The mold holding unit 5 holds the mold 2 by drawing or attracting it by a vacuum suction force or an electrostatic force. The mold holding unit 5 moves the mold 2 in the Z direction to selectively perform an operation (imprint) of bringing the mold 2 and the imprint material 3 on the substrate into contact with each other and an operation (mold separation) of separating the mold 2 from the imprint material 3 on the substrate. The mold holding unit 5 may be configured to move the mold 2 not only in the Z direction but also in the X direction and the Y direction. Furthermore, the mold holding unit 5 may include a tilt mechanism for adjusting the position of the mold 2 in the θZ direction and the tilt of the mold 2 with respect to the X-Y plane.

The imprint apparatus 10 of this embodiment implements imprint and mold separation by moving the mold 2 in the Z direction. However, imprint and mold separation may be implemented by moving the substrate 1 in the Z direction. Alternatively, imprint and mold separation may be implemented by relatively moving the substrate 1 and the mold 2 in the Z direction.

The supply unit 6 (discharge outlet or dispenser) is arranged near the mold holding unit 5, and supplies the imprint material 3 to at least one shot region (forming region) on the substrate 1. The supply unit 6 adopts, for example, an inkjet method, and discretely supplies (arranges) the imprint material 3 as a plurality of droplets onto the substrate 1. The supply unit 6 includes, for example, a piezo-type discharge mechanism (inkjet head) including a plurality of discharge outlets. The volume (droplet volume or droplet amount) of a droplet of the imprint material 3 discharged from each discharge outlet can be adjusted within a range of 0.1 to 10 pL/drop, and about 1 pL/drop is normally often used.

The supply amount of the imprint material 3 onto the substrate 1 by the supply unit 6 can be determined based on the density of the pattern of the mold 2 and the target film thickness of the imprint material 3. The supply unit 6 discretely arranges the imprint material 3 as a plurality of droplets on the shot region in accordance with an arrangement recipe (a layout recipe) created (determined) by an information processing apparatus 20 (to be described later). The arrangement recipe can include, for example, the volume (droplet volume) of each droplet and an arrangement grid (arrangement pattern and drop positions) for arranging the plurality of droplets on the shot region. The target film thickness of the imprint material 3 indicates the target value (desired value) of a film thickness to be obtained in the cured product of the imprint material 3 formed on the substrate by the imprint process, and can be defined by the residual layer thickness and the depth of the concave portion in the pattern having concave and convex portions of the mold 2. Since the depth of the concave portion in the pattern having concave and convex portions of the mold 2 is known information obtained from design data of the mold 2, the target film thickness of the imprint material 3 may be understood as the target value of the residual layer thickness. Note that the residual layer thickness (RLT) indicates the film thickness between the substrate 1 and the concave portion in the pattern of the cured product of the imprint material 3 formed on the substrate 1 by the imprint process.

The curing unit 7 (irradiation unit) cures the imprint material 3 by irradiating the imprint material 3 with light (for example, ultraviolet light) via the mold 2 in a state in which the mold 2 and the imprint material 3 on the substrate are in contact with each other. The curing unit 7 can include, for example, a light source that emits light to cure the imprint material 3, and an optical system that shapes (adjusts) light emitted from the light source into light suitable for the imprint process.

The control unit 8 is formed by, for example, a computer including a processor such as a Central Processing Unit (CPU) and a storage unit such as a memory, and comprehensively controls the respective units of the imprint apparatus 10 in accordance with programs stored in the storage unit. The control unit 8 controls the imprint process of transferring the pattern of the mold 2 to the imprint material 3 on the substrate by controlling the adjustment and the operation of each unit of the imprint apparatus 10.

The information processing apparatus 20 is formed by, for example, at least one computer including a CPU and a memory, and creates (determines) an arrangement recipe for discretely arranging the imprint material 3 as a plurality of droplets on the substrate (shot region) by the supply unit 6. The arrangement recipe created by the information processing apparatus 20 is supplied to the control unit 8, and the control unit 8 controls the supply (arrangement) of the imprint material onto the substrate by the supply unit 6 in accordance with the arrangement recipe created by the information processing apparatus 20. In this example, the information processing apparatus 20 of this embodiment is formed as a part of the imprint apparatus 10. However, the present invention is not limited to this, and the information processing apparatus 20 may be arranged separately from the imprint apparatus 10. That is, the information processing apparatus 20 may be arranged as an external apparatus of the imprint apparatus 10. Note that the determination method (creation method) of the arrangement recipe in the information processing apparatus 20 will be described later.

Next, the imprint process (imprint method) by the imprint apparatus 10 will be described. The mold 2 is conveyed to a position under the mold holding unit 5 by a mold conveyance mechanism (not shown), and is held (fixed) by the mold holding unit 5. The substrate 1 is conveyed (placed) onto the substrate stage 4 by a substrate conveyance mechanism (not shown), and is held by the substrate stage 4. Then, the imprint process is executed for each of a plurality of shot regions on the substrate 1.

Figure 2:
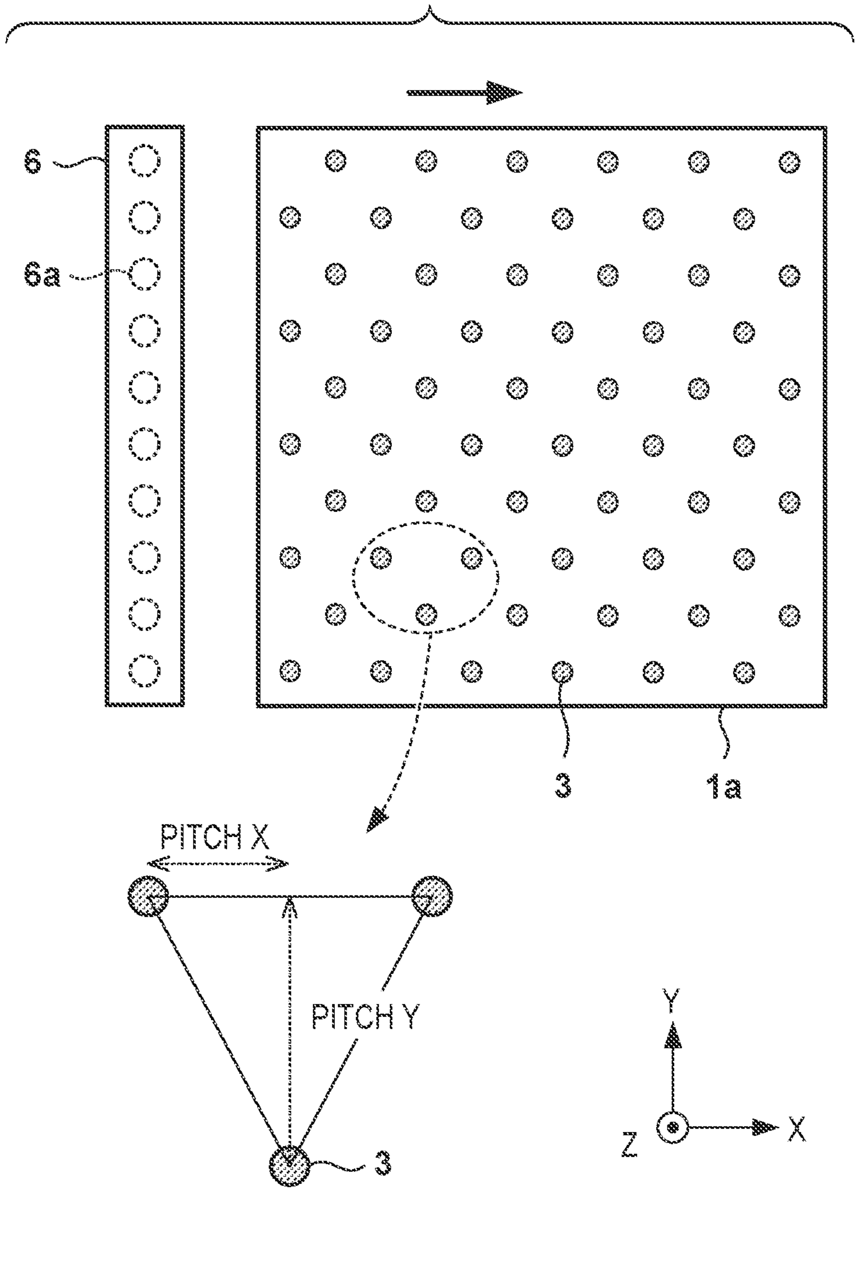
FIG. 2 is a view schematically showing an array of a plurality of discharge outlets in a supply unit and an array of a plurality of droplets on a substrate (shot region)

In the imprint process for one shot region, first, the substrate 1 is moved by the substrate stage 4 so that the shot region of the substrate 1 is located at a supply position under the supply unit 6, and the imprint material 3 is supplied as a plurality of droplets onto the shot region (supply step). More specifically, as shown in FIG. 2, the supply unit 6 includes a plurality of discharge outlets 6*a* (a plurality of nozzles) arrayed at a predetermined pitch in a non-scanning direction (the first direction (for example, the Y direction)). Then, in the supply step, while a shot region 1*a* of the substrate 1 is scanned in a scanning direction (the second direction (for example, the X direction)) by the substrate stage 4 with respect to the plurality of discharge outlets 6*a*, the discharge of droplets of the imprint material 3 from each of the plurality of discharge outlets 6*a* is controlled. This can supply (arrange) the imprint material 3 as a plurality of droplets onto the shot region 1*a* of the substrate 1. The supply step is executed in accordance with the arrangement recipe created by the information processing apparatus 20.

In this example, in the supply step, a region on the substrate to which the imprint material 3 is supplied need not be the entire shot region of the substrate 1, and may be a partial region of the shot region. The partial region can have an arbitrary shape such as a rectangular shape. FIG. 2 is a view schematically showing the array of the plurality of discharge outlets 6*a* in the supply unit 6 and the array of the plurality of droplets on the substrate 1 (shot region 1*a*), and the number of discharge outlets 6*a*, the arrangement shape and arrangement density of the droplets, and the like are not limited to those in the example shown in FIG. 2. Furthermore, the non-scanning direction (first direction) and the scanning direction (second direction) are not limited to the directions orthogonal to each other and need only be directions intersecting each other.

After the end of the supply step, the substrate 1 is moved by the substrate stage 4 so that the shot region of the substrate 1 is located at an imprint position under the mold 2, thereby aligning the mold 2 (pattern region) and the shot region. Then, the mold holding unit 5 drives the mold 2 in the −Z direction, thereby bringing the mold 2 into contact with the imprint material 3 on the shot region (contact step). Furthermore, in the contact step, the shape of a contact area where the mold 2 first contacts the imprint material 3 on the substrate is a circular shape or a shape similar to this, and the imprint material 3 spreads outward from the centroid (center) of the shot region while maintaining the shape. Along with this, the pattern (concave portion) having concave and convex portions of the mold 2 is filled with the imprint material 3.

In this example, in the contact step, bubbles may enter the space between the mold 2 and the substrate 1. If such bubbles exist, defects (unfilled defects) may occur in the pattern of the imprint material formed by the imprint process. Therefore, in the contact step, to reduce entering of bubbles, the imprint material 3 and the mold 2 may start to contact each other in a state in which the mold 2 is deformed in a convex shape toward the substrate 1. Alternatively, a gas that has at least one of the properties of high solubility and high diffusivity with respect to the imprint material 3 may be supplied to the space between the mold 2 and the substrate 1.

After the end of the contact step, in a state in which the mold 2 and the imprint material 3 on the shot region of the substrate 1 are in contact with each other, the curing unit 7 cures the imprint material 3 by irradiating the imprint material 3 with light via the mold 2 for a predetermined time (curing step). Then, after the imprint material 3 is cured, the mold holding unit 5 drives the mold 2 in the +Z direction to separate the mold 2 from the cured imprint material 3 (separation step). This forms, on the shot region of the substrate 1, a pattern (layer) of the imprint material in a three-dimensional shape in conformance with the pattern having concave and convex portions of the mold 2. By executing the series of imprint processes for each of the plurality of shot regions on the substrate 1, it is possible to form the pattern of the imprint material on each of the plurality of shot regions.

As described above, if bubbles enter the space between the mold 2 and the substrate 1 in the imprint process, defects may occur in the pattern of the imprint material formed on the substrate by the imprint process. The bubbles may be reduced with a lapse of time but if reduction of the bubbles is awaited, it may become disadvantageous in terms of the productivity (throughput). Therefore, in the imprint process, to reduce defects and obtain high productivity, that is, to accurately and efficiently form the imprint material 3 on the substrate using the mold 2, it is desirable to arrange the imprint material 3 as a plurality of droplets on the substrate.

It was found as a result of earnest examinations of the present inventor that it is possible to reduce the number of defects occurring in the imprint material 3 by the imprint process (to be sometimes simply referred to as "the number of defects" hereinafter) in accordance with the pitch ratio of the imprint material 3 arranged as a plurality of droplets on the substrate. Therefore, in this embodiment, an arrangement recipe for discretely arranging the imprint material 3 as a plurality of droplets on the shot region is determined by setting an arrangement grid so that the number of defects is smaller than a predetermined value based on information representing the relationship between the pitch ratio and the number of defects. By arranging the imprint material 3 as a plurality of droplets on the substrate in accordance with the thus determined arrangement recipe, it is possible to reduce defects occurring in the imprint material 3 on the substrate by the imprint process.

As shown in FIG. 2, the pitch ratio can be defined as a ratio between a pitch Y (first pitch) of droplets in the non-scanning direction (Y direction) and a pitch X (second pitch) of droplets in the scanning direction (X direction). In this embodiment, the ratio of the pitch Y to the pitch X is defined as the pitch ratio, and will sometimes be referred to as "the pitch ratio Y/X" hereinafter. As described above, the arrangement recipe can include the volume (droplet volume) of a droplet to be discharged from each discharge outlet 6*a* of the supply unit 6, and an arrangement grid representing positions where the imprint material is arranged as a plurality of droplets on the shot region of the substrate. In this embodiment, the arrangement grid is obtained by arranging unit grids in each of which three droplets are arranged in a triangular shape, but may be obtained by arranging unit grids in each of which four droplets are arranged in a rectangular shape.

[Relationship Between Pitch Ratio and Number of Defects]

Figure 3:
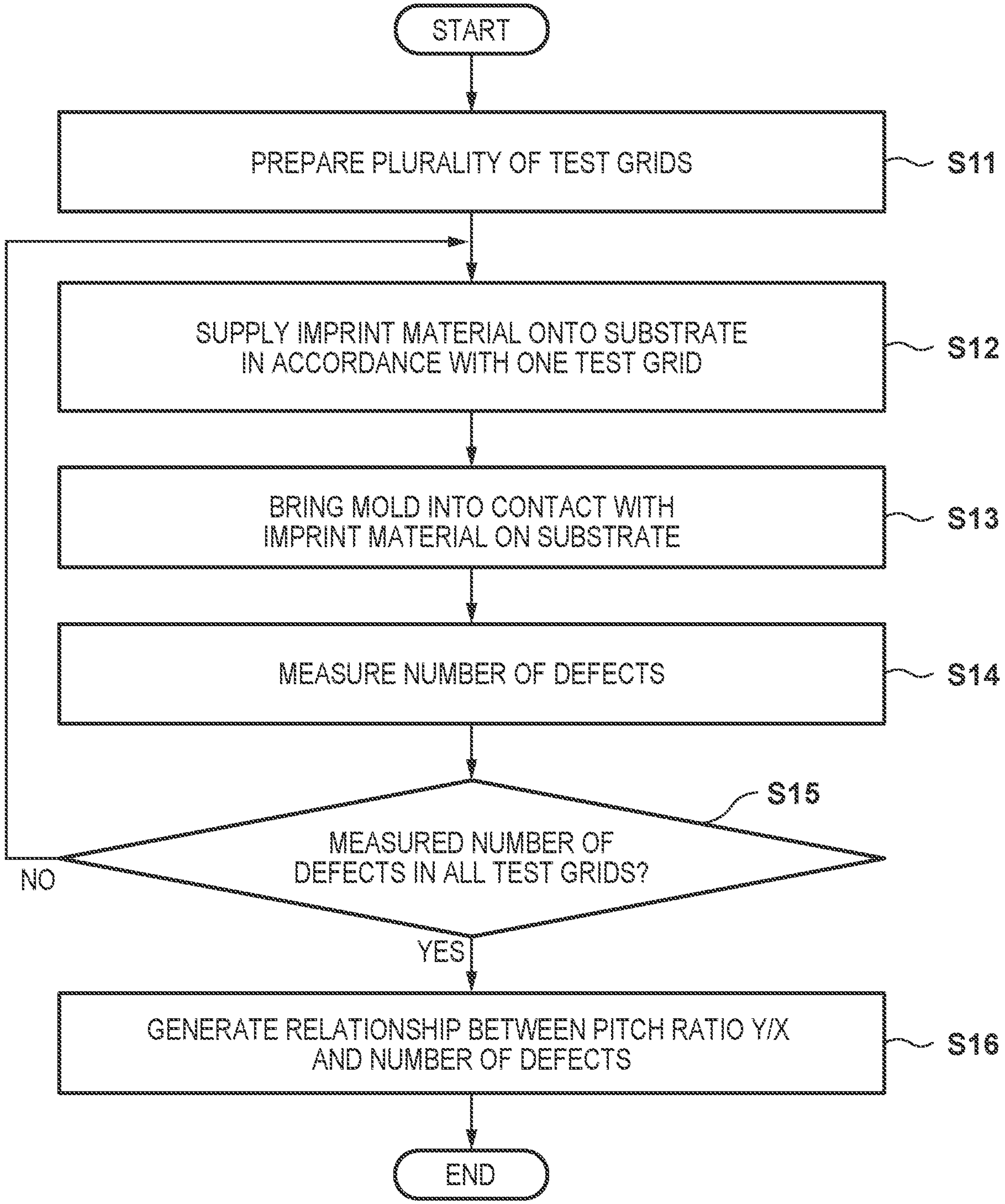
FIG. 3 is a flowchart for generating the relationship between a pitch ratio Y/X and the number of defects.

The relationship between the pitch ratio Y/X and the number of defects will be described next. FIG. 3 is a flowchart for generating the relationship between the pitch ratio Y/X and the number of defects. The flowchart shown in FIG. 3 can be executed by the information processing apparatus 20 or the control unit 8. In this embodiment, an example of obtaining the relationship between the pitch ratio Y/X and the number of defects by an experiment will be described but the relationship may be obtained using a simulation.

In step S11, a plurality of test grids having different pitch ratios Y/X are prepared. In step S12, the supply unit 6 supplies (arranges) the imprint material as a plurality of droplets onto the substrate in accordance with one of the plurality of test grids. As the substrate used in step S12, a test substrate can be used. Next, in step S13, the mold 2 is brought into contact with the imprint material supplied as the plurality of droplets onto the substrate in step S12.

In step S14, the number of defects that have occurred in the imprint material on the substrate for a predetermined elapsed time is measured. The predetermined elapsed time can arbitrarily be set but is preferably set to, for example, a time until curing of the imprint material is started in an actual imprint process. Alternatively, the predetermined elapsed time may be an elapsed time after the start or the end of the supply of the imprint material in step S12 or an elapsed time after the start or the end of the contact of the mold 2 in step S13. At this time, the number of defects can be measured using a measurement unit provided in the imprint apparatus 10 but may be measured using a measurement apparatus provided outside the imprint apparatus 10. Each of the measurement unit and the measurement apparatus includes, for example, an image capturing device, and can be configured to measure the number of defects from an image obtained by the image capturing device.

Figure 4:
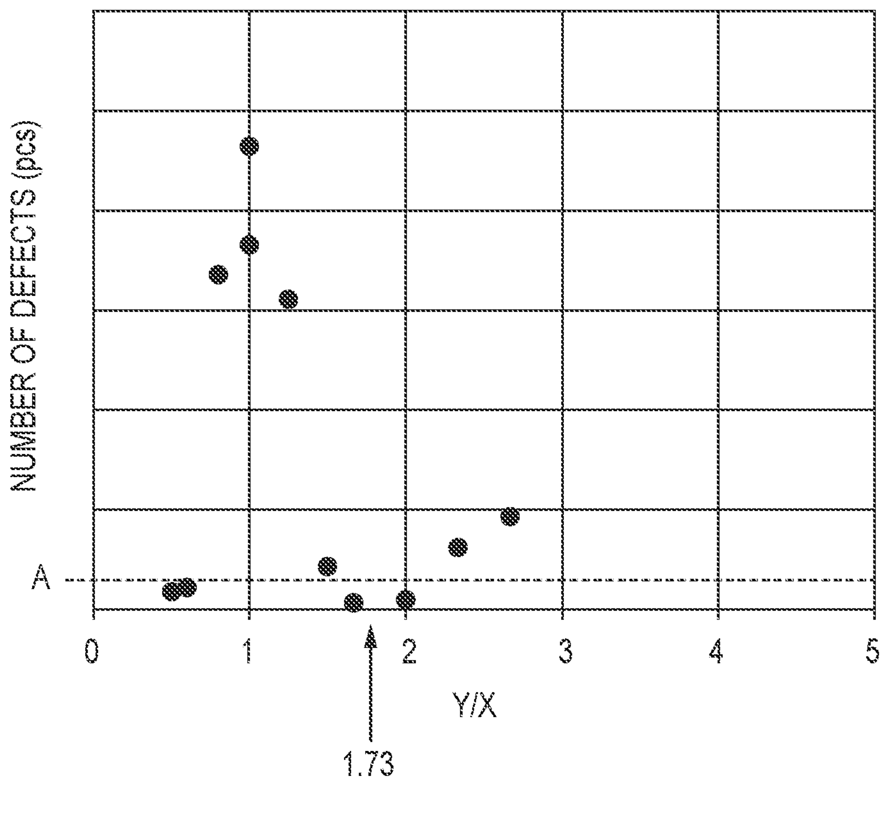
FIG. 4 is a graph showing an example of the relationship between the pitch ratio Y/X and the number of defects.

In step S15, it is determined whether the number of defects has been measured for all the plurality of test grids prepared in step S11. If there is a test grid for which the number of defects has not been measured, the process returns to step S12, and the number of defects is measured using the test grid. On the other hand, if the number of defects has been measured for all the plurality of test grids, the process advances to step S16. In step S16, based on the measurement results of the number of defects obtained for the plurality of test grids, the relationship between the pitch ratio Y/X and the number of defects is generated. FIG. 4 is a graph showing an example of the relationship between the pitch ratio Y/X and the number of defects. In the example shown in FIG. 4, it is found that the number of defects is smallest around a pitch ratio of 1.73.

In this example, since the relationship between the pitch ratio Y/X and the number of defects changes in accordance with the type of the pattern having concave and convex portions formed in the mold 2, the relationship can be generated for each mold 2 in accordance with the flowchart shown in FIG. 3. The type of the pattern having concave and convex portions formed in the mold 2 can be defined by, for example, the presence/absence of the pattern having concave and convex portions, the density of the concave portion in the pattern having concave and convex portions, the depth of the concave portion, and/or the width of the concave portion. Then, the relationship generated for each mold 2 can be stored in the memory of the information processing apparatus 20.

[Determination Method of Arrangement Recipe]

Figure 5:
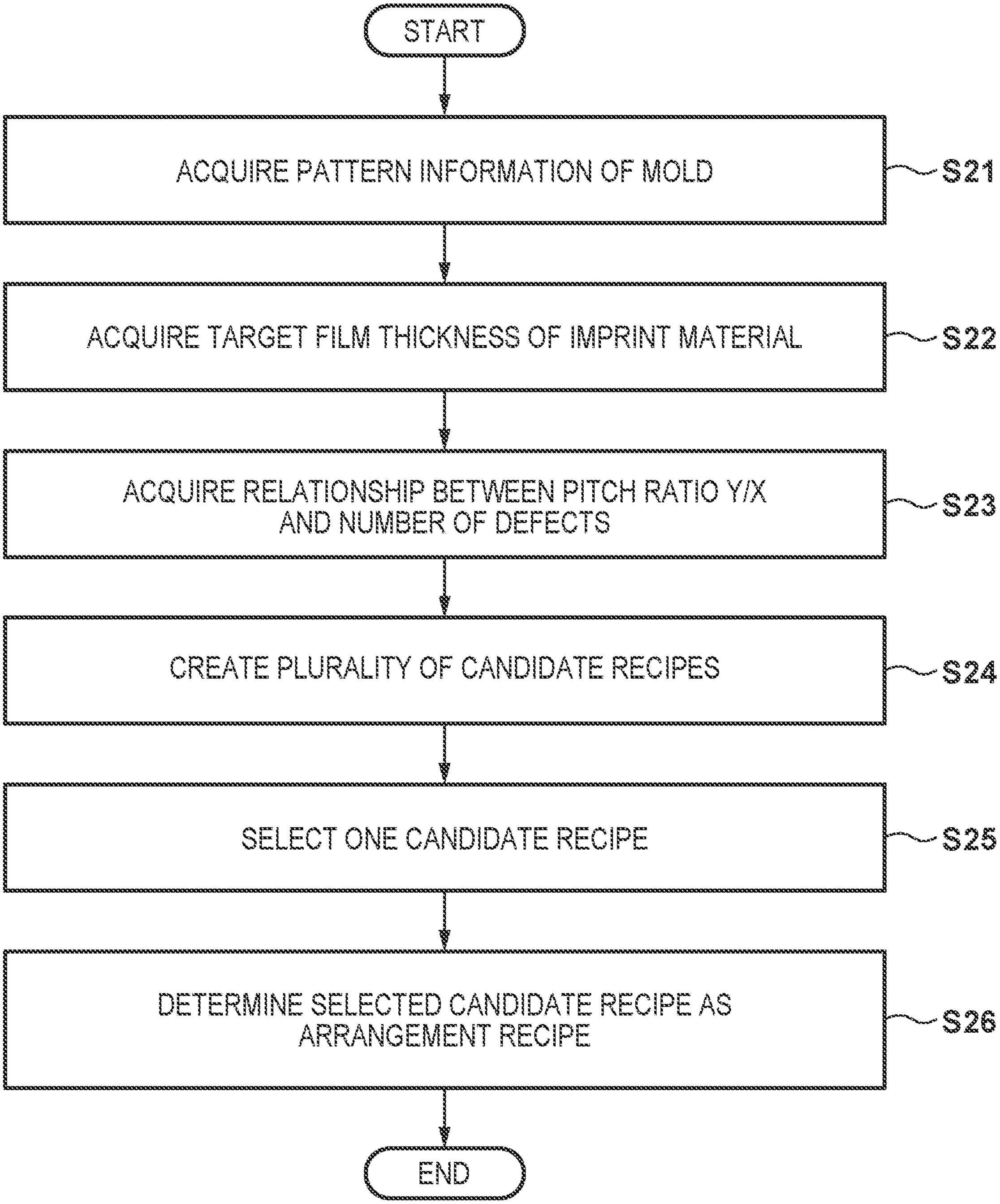
FIG. 5 is a flowchart illustrating a determination method of an arrangement recipe according to the first embodiment.

The determination method (creation method) of the arrangement recipe will be described next. FIG. 5 is a flowchart illustrating the determination method of the arrangement recipe. The flowchart shown in FIG. 5 can be executed by the information processing apparatus 20.

In step S21, the information processing apparatus 20 acquires the pattern information of the mold 2 for which the arrangement recipe is to be determined. The pattern information of the mold 2 may be understood as information representing the type of the pattern having concave and convex portions formed in the mold 2, may be input by the user, or may be acquired from a server based on the identification ID of the mold 2.

In step S22, the information processing apparatus 20 acquires the target film thickness of the imprint material 3. As described above, the target film thickness of the imprint material 3 is a target value of a film thickness to be obtained in the cured product of the imprint material 3 formed on the substrate by the imprint process, and can be input by the user. As the target film thickness of the imprint material 3, the target value of the residual layer thickness may be used.

In step S23, based on the pattern information of the mold 2 acquired in step S21, the information processing apparatus 20 acquires the relationship between the pitch ratio Y/X and the number of defects, that has been generated using the mold 2. Note that step S23 may be performed before step S22.

Steps S24 to S26 correspond to a step of setting an arrangement grid so that the number of defects is smaller than the predetermined value based on the relationship between the pitch ratio Y/X and the number of defects, which has been acquired in step S23, and determining a arrangement recipe based on the set arrangement grid. In this step, the arrangement grid can be set so as to reduce the volume (to be sometimes referred to as the droplet volume hereinafter) of each droplet for making the imprint material 3 on the substrate formed by the imprint process have the target film thickness while the number of defects is smaller than the predetermined value. If the droplet volume is reduced, the distance between the plurality of droplets is decreased, and bubbles are hardly generated in the space between the substrate 1 and the mold 2, thereby making it difficult for defects to occur.

In step S24, the information processing apparatus 20 creates a plurality of candidate recipes based on the relationship between the pitch ratio Y/X and the number of defects, which has been acquired in step S23. More specifically, based on the relationship between the pitch ratio Y/X and the number of defects, which has been acquired in step S23, a plurality of candidate grids are created so that the number of defects is smaller than the predetermined value. In this embodiment, the plurality of candidate grids are set by calculating integer multiples of the pitches in the X direction and the Y direction between the plurality of discharge outlets 6*a* in the supply unit 6. Furthermore, based on the target film thickness acquired in step S22, a droplet volume is calculated for each candidate grid. That is, in step S24, a plurality of candidate recipes each formed from a combination of the droplet volume and the arrangement of the droplets of the imprint material 3 by the candidate grid can be created. The droplet volume needs to satisfy the condition of a range (for example, a range of 0.1 to 10 pL/drop) within which each discharge outlet 6*a* of the supply unit 6 can discharge a droplet. Therefore, the plurality of candidate recipes (candidate grids) can be set so that each droplet volume satisfies the condition.

In step S25, the information processing apparatus 20 selects one of the plurality of candidate recipes in accordance with the droplet volume. As described above, if the droplet volume is small, the distance between the plurality of droplets is small accordingly, and thus bubbles tend to be hardly generated in the space between the substrate 1 and the mold 2. That is, the number of defects occurring in the imprint material on the substrate via the imprint process tends to decrease. Therefore, in step S25, among the plurality of candidate recipes, the candidate recipe whose droplet volume is smallest is preferably determined (selected) as an arrangement recipe to be used for the imprint process. Next, in step S26, the information processing apparatus 20 determines, as an arrangement recipe to be used for the imprint process, the candidate recipe selected in step S25.

Example 1

Example 1 of this embodiment will be described next. An example in which the relationship between a pitch ratio Y/X and the number of defects, which has been acquired based on the pattern information of a mold, is a relationship shown in FIG. 4 will be described. The relationship, shown in FIG. 4, between the pitch ratio Y/X and the number of defects can be obtained in, for example, a case where there is no pattern having concave and convex portions in a mold 2 or a case where the density of the concave portion of a pattern having concave and convex portions in the mold 2 is 5%. Furthermore, in FIG. 4, the number of defects is smallest around a pitch ratio Y/X of 1.73. In the following description, the pitch ratio Y/X when the number of defects is smallest is set as an optimum pitch ratio (target ratio). The optimum pitch ratio is not limited to the pitch ratio Y/X when the number of defects is smallest in this relationship, and may be set within the range of the pitch ratio Y/X within which the number of defects is smaller than a predetermined value A in this relationship. Furthermore, in Example 1, the pitch between discharge outlets 6*a* is 22 μm and "Y" and "X" are defined as the magnifications (coefficients) of the pitch between the discharge outlets 6*a*.

In Example 1, based on the relationship, shown in FIG. 4, between the pitch ratio Y/X and the number of defects, a plurality of candidate grids are set by calculating integer multiples of the pitches in the X direction and the Y direction between the discharge outlets 6*a* so that the number of defects is smaller than the predetermined value A. The plurality of candidate grids are preferably set so that the pitch ratio Y/X of each candidate grid is close to the optimum pitch ratio. As an example, a first candidate grid of "X=4, Y=7, Y/X=1.75" and a second candidate grid of "X=6, Y=10, Y/X=1.67" are set. In Example 1, the target value (target film thickness) of the residual layer thickness is 20 nm, and the dimensions in the X direction and the Y direction of a shot region for which an arrangement recipe is to be determined are 26 mm and 33 mm, respectively. In this case, a droplet volume in the first candidate grid is calculated as 0.505 pL and a droplet volume in the second candidate grid is calculated as 1.085 pL. In Example 1, the pitch ratio Y/X is closer to the optimum pitch ratio and the droplet volume is smaller in the first candidate grid than in the second candidate grid. Therefore, the first candidate grid (X=4, Y=7, Y/X=1.75) and the droplet volume (0.505 pL) are determined as an arrangement recipe.

As described above, in this embodiment, based on the information representing the relationship between the pitch ratio and the number of defects, the arrangement grid is set so that the number of defects is smaller than the predetermined value, thereby determining an arrangement recipe for arranging the imprint material 3 as a plurality of droplets on the substrate. Thus, to reduce defects and obtain high productivity, that is, to accurately and efficiently form the imprint material 3 on the substrate using the mold 2, it is possible to arrange the imprint material 3 as a plurality of droplets on the substrate.

Second Embodiment

The second embodiment of the present invention will be described. In this embodiment, a plurality of provisional grids are created by calculating integer multiples of the pitches in the X direction and the Y direction between a plurality of discharge outlets 6*a* in a supply unit 6. Then, a plurality of candidate grids are created by adjusting the magnification in the Y direction (the scanning direction or the second direction) so that a pitch ratio Y/X becomes an optimum pitch ratio (target ratio) for each of the plurality of provisional grids. Note that this embodiment basically takes over the first embodiment, and matters other than those to be mentioned below can comply with the first embodiment.

Figure 6:
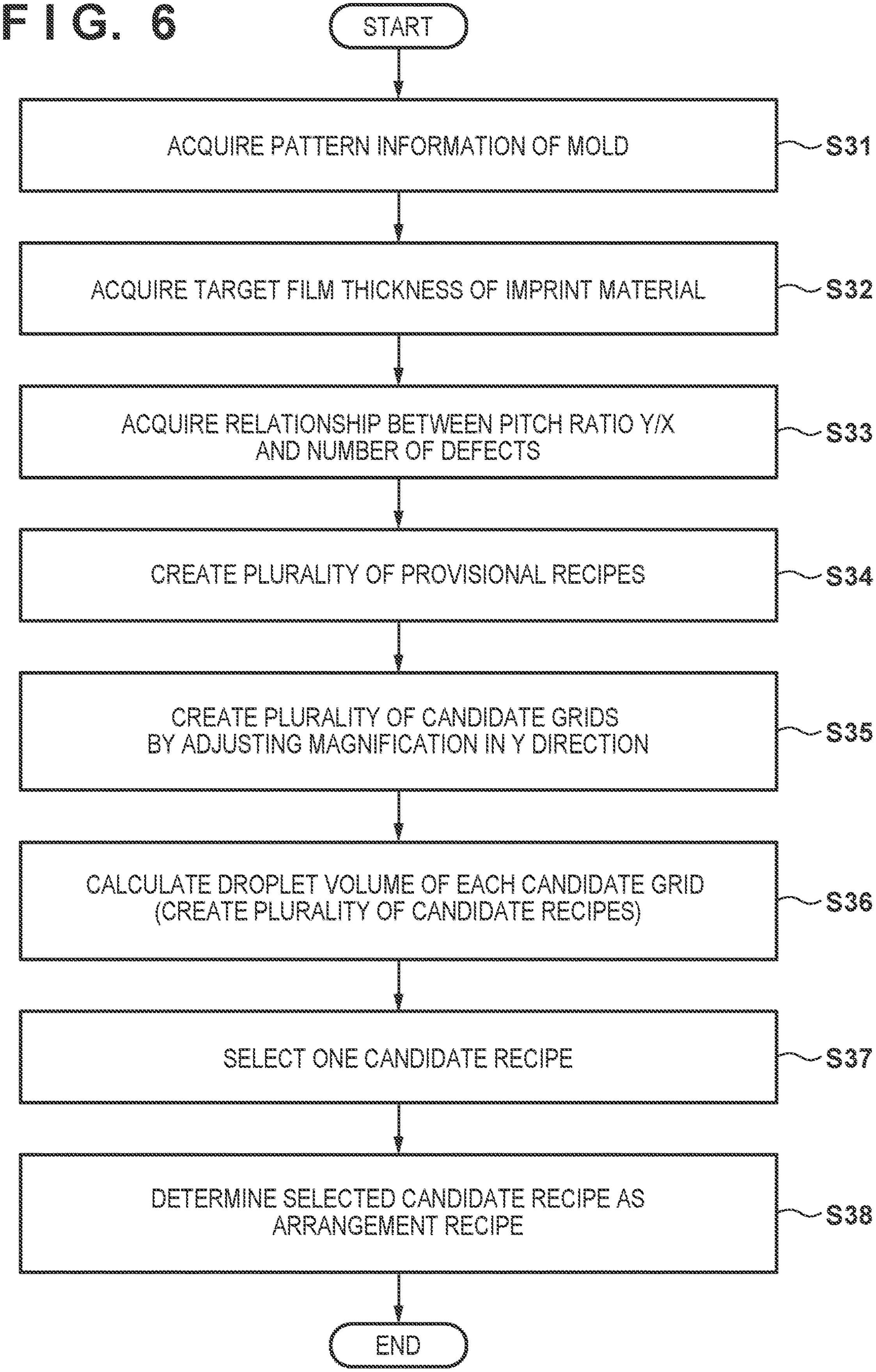
FIG. 6 is a flowchart illustrating a determination method of an arrangement recipe according to the second embodiment.

FIG. 6 is a flowchart illustrating a determination method of an arrangement recipe according to this embodiment. The flowchart shown in FIG. 6 can be executed by an information processing apparatus 20. Steps S31 to S33 of FIG. 6 are the same as steps S21 to S23 of FIG. 5, and a detailed description thereof will be omitted. Steps S34 to S38 of FIG. 6 correspond to a step of setting an arrangement grid so that the number of defects is smaller than a predetermined value based on the relationship between the pitch ratio Y/X and the number of defects, which has been acquired in step S33, and determining an arrangement recipe based on the set arrangement grid. In this step as well, similar to steps S24 to S26 of FIG. 5, the arrangement grid can be set so as to reduce a droplet volume while the number of defects is smaller than the predetermined value.

In step S34, the information processing apparatus 20 creates a plurality of provisional recipes based on the relationship between the pitch ratio Y/X and the number of defects, which has been acquired in step S33. More specifically, a plurality of provisional recipes are created so that the number of defects is smaller than the predetermined value based on the relationship between the pitch ratio Y/X and the number of defects, which has been acquired in step S33. In this embodiment, a plurality of provisional grids are set by calculating integer multiples of the pitches in the X direction and the Y direction between the plurality of discharge outlets 6*a* in the supply unit 6. Furthermore, the droplet volume is calculated for each provisional grid based on a target film thickness acquired in step S32. That is, in step S34, a plurality of provisional recipes each formed from a combination of the droplet volume and the arrangement of droplets of an imprint material 3 by the provisional grid are created. In this example, the plurality of provisional recipes (provisional grids) can be set so that each droplet volume satisfies the condition of a range (for example, a range of 0.1 to 10 pL/drop) within which each discharge outlet 6*a* of the supply unit 6 can discharge a droplet.

In step S35, the information processing apparatus 20 creates a plurality of candidate grids by adjusting the magnification in the Y direction (the scanning direction or the second direction) in each provisional grid so that the pitch ratio Y/X becomes the target ratio. The magnification in the Y direction defines the scanning speed of a substrate 1 while a composition is arranged on the substrate (that is, in the supply step), and the scanning speed of the substrate 1 can finely be adjusted by controlling a substrate stage 4. That is, in this embodiment, by adjusting the magnification (that is, a pitch Y) in the Y direction in each provisional grid by the scanning speed of the substrate 1, a plurality of candidate grids each having the pitch ratio Y/X equal to the target ratio are created. Note that the magnification (that is, a pitch X) in the X direction cannot be adjusted since it is fixed by the pitch between the discharge outlets 6*a* in the supply unit 6.

It is necessary to adjust the magnification in the Y direction so that the scanning speed of the substrate 1 falls within a first limiting range. The first limiting range is the range of the scanning speed of the substrate 1 within which a plurality of droplets can be located on the substrate at a desired resolution, and can be preset by an experiment, a simulation, or the like. Furthermore, in step S35, for each of the plurality of candidate grids, the scanning speed of the substrate 1 changed in accordance with the adjustment of the magnification in the Y direction can be determined (adjusted).

In step S36, the information processing apparatus 20 calculates a droplet volume for each candidate grid. In step S35 described above, each candidate grid is created by adjusting the magnification in the Y direction in each provisional grid, and thus the number of droplets changes along with the adjustment of the magnification in the Y direction. Therefore, the droplet volume needs to be changed in accordance with the adjustment of the magnification in the Y direction so as to implement the target film thickness. Thus, in step S36, the droplet volume for each candidate grid is calculated again based on the target film thickness acquired in step S32.

The plurality of candidate grids created in step S35 and the droplet volumes calculated in step S36 for the respective candidate grids form the plurality of candidate recipes. Therefore, steps S35 and S36 may be understood as a step of creating the plurality of candidate recipes. Furthermore, each of the plurality of candidate recipes may include information representing the scanning speed of the substrate 1 determined along with the magnification in the Y direction.

In step S37, the information processing apparatus 20 selects one of the plurality of candidate recipes in accordance with the droplet volume. Next, in step S38, the information processing apparatus 20 determines, as an arrangement recipe to be used for an imprint process, the candidate recipe selected in step S37. Steps S37 and S38 are the same as steps S25 and S26 of FIG. 5 and a detailed description thereof will be omitted.

Example 2

Example 2 of this embodiment will be described next. An example in which the relationship between a pitch ratio Y/X and the number of defects, that has been acquired based on the pattern information of a mold, is a relationship shown in FIG. 4 will be described. The relationship, shown in FIG. 4, between the pitch ratio Y/X and the number of defects can be obtained in, for example, a case where there is no pattern having concave and convex portions in a mold 2 or a case where the density of the concave portion of a pattern having concave and convex portions in the mold 2 is 5%. Furthermore, in FIG. 4, the number of defects is smallest around a pitch ratio Y/X of 1.73. In the following description, the pitch ratio Y/X when the number of defects is smallest can be set as an optimum pitch ratio (target ratio). Furthermore, in Example 2, the pitch between discharge outlets 6*a* is 22 μm and "Y" and "X" are defined as the magnifications (coefficients) of the pitch between the discharge outlets 6*a*.

In Example 2, based on the relationship, shown in FIG. 4, between the pitch ratio Y/X and the number of defects, a plurality of provisional grids are set by calculating integer multiples of the pitches in the X direction and the Y direction between the discharge outlets 6*a* so that the number of defects is smaller than a predetermined value A. The plurality of provisional grids are preferably set so that the pitch ratio Y/X of each provisional grid is close to the optimum pitch ratio (target ratio). As an example, a first provisional grid of “X=5, Y=9, Y/X=1.8” and a second provisional grid of “X=6, Y=10, Y/X=1.67” are set. In Example 2, the target value (target film thickness) of a residual layer thickness is 20 nm, and the dimensions in the X direction and the Y direction of a shot region for which an arrangement recipe is to be determined are 26 mm and 33 mm, respectively. In this case, a droplet volume in the first provisional grid is calculated as 0.813 pL and a droplet volume in the second provisional grid is calculated as 1.085 pL.

Next, a plurality of candidate grids are created by adjusting the magnification in the Y direction so that the pitch ratio Y/X becomes the optimum pitch ratio (target ratio) for each of the plurality of provisional grids (first and second provisional grids). Furthermore, the droplet volume is calculated again for each candidate grid.

Figure 7A:
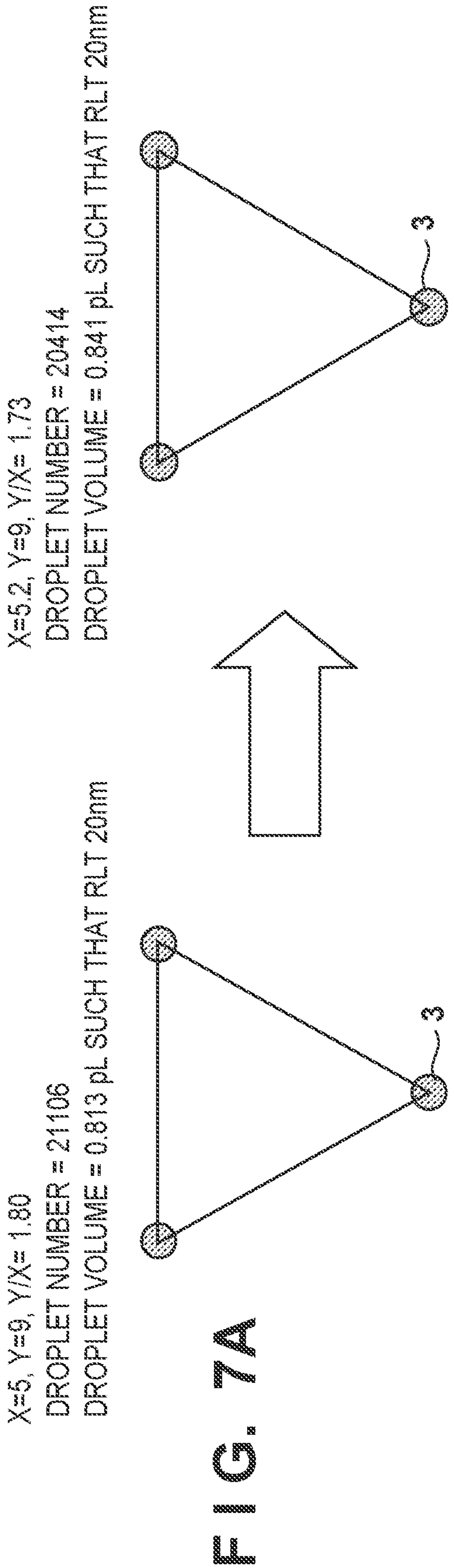
FIGS. 7A and 7B are views for explaining adjustment of a magnification in the Y direction according to the second embodiment.

More specifically, as shown in FIG. 7A, a first candidate grid of “X=5.20, Y=9, Y/X=1.73” is created by adjusting the magnification in the Y direction so that the pitch ratio Y/X becomes the optimum pitch ratio (target ratio) with respect to the first provisional grid. In this case, since the number of droplets decreases from 21,106 to 20,414 along with the change from the first provisional grid to the first candidate grid, the droplet volume for setting the target value (target film thickness) of the residual layer thickness to 20 nm is changed from 0.813 pL to 0.841 pL.

Figure 7B:
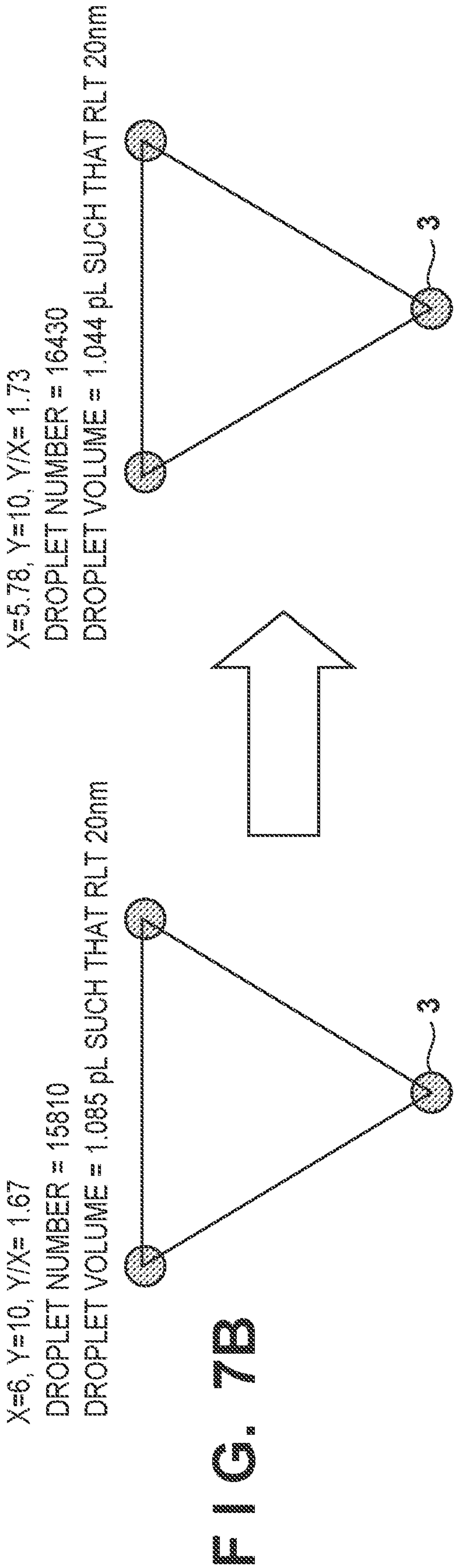

Similarly, as shown in FIG. 7B, a second candidate grid of “X=5.78, Y=10, Y/X=1.73” is created by adjusting the magnification in the Y direction so that the pitch ratio Y/X becomes the optimum pitch ratio (target ratio) with respect to the second provisional grid. In this case, since the number of droplets increases from 15,810 to 16,430 along with the change from the second provisional grid to the second candidate grid, the droplet volume for setting the target value (target film thickness) of the residual layer thickness to 20 nm is changed from 1.085 pL to 1.044 pL.

In Example 2, the droplet volume is smaller in the first candidate grid than in the second candidate grid. Therefore, the first candidate grid (X=5.20, Y=9, Y/X=1.73) and the droplet volume (0.841 pL) are determined as an arrangement recipe. In the above-described second embodiment as well, similar to the first embodiment, it is possible to arrange the imprint material 3 as a plurality of droplets on the substrate so as to accurately and efficiently form the imprint material 3 on the substrate using the mold 2.

Third Embodiment

The third embodiment of the present invention will be described. Similar to the second embodiment, this embodiment will describe an example of adjusting a magnification in the Y direction (the scanning direction or the second direction) so that a pitch ratio Y/X becomes an optimum pitch ratio (target ratio). More specifically, a plurality of provisional grids are created by calculating integer multiples of the pitches in the X direction and the Y direction between a plurality of discharge outlets 6*a* in a supply unit 6. Then, a plurality of candidate grids are created by adjusting the magnification in the Y direction (the scanning direction or the second direction) so that the pitch ratio Y/X becomes the optimum pitch ratio (target ratio) for each of the plurality of provisional grids. However, although the second embodiment has explained the example of adjusting the magnification in the Y direction by the scanning speed of the substrate 1, this embodiment will describe an example of adjusting the magnification in the Y direction by a droplet discharge frequency from each discharge outlet 6*a* of the supply unit 6. Note that this embodiment basically takes over the second embodiment, and matters other than those to be mentioned below can comply with the second embodiment.

A determination method of an arrangement recipe according to this embodiment can be performed in accordance with the flowchart shown in FIG. 6 described in the second embodiment. However, this embodiment is different from the second embodiment in terms of step S35 of the flowchart of FIG. 6. Therefore, step S35 will be described below.

In step S35, an information processing apparatus 20 creates a plurality of candidate grids by adjusting the magnification in the Y direction (the scanning direction or the second direction) in each provisional grid so that the pitch ratio Y/X becomes the target ratio. The magnification in the Y direction defines a droplet discharge frequency from each discharge outlet 6*a* while a composition is arranged on the substrate (that is, in the supply step), and the discharge frequency can finely be adjusted by controlling a piezo-type discharge mechanism in each discharge outlet 6*a*. That is, in this embodiment, by adjusting the magnification (that is, a pitch Y) in the Y direction in each provisional grid by the discharge frequency of each discharge outlet 6*a*, a plurality of candidate grids each having the pitch ratio Y/X equal to the target ratio are created.

Note that it is necessary to adjust the magnification in the Y direction so that the discharge frequency of each discharge outlet 6*a* falls within a second limiting range. The second limiting range is the range of the discharge frequency of each discharge outlet 6*a* within which a plurality of droplets can be located on the substrate at a desired resolution, and can be preset by an experiment, a simulation, or the like. Furthermore, in step S35, for each of the plurality of candidate grids, the discharge frequency of each discharge outlet 6*a* changed in accordance with the adjustment of the magnification in the Y direction can be determined (adjusted). Each of a plurality of candidate recipes created by executing steps S35 and S36 may include information representing the discharge frequency of each discharge outlet 6*a* determined along with the magnification in the Y direction.

In the above-described third embodiment as well, similar to the first and second embodiments, it is possible to arrange an imprint material 3 as a plurality of droplets on the substrate so as to accurately and efficiently form the imprint material 3 on the substrate using a mold 2.

Fourth Embodiment

The fourth embodiment of the present invention will be described. This embodiment basically takes over the first embodiment, and matters other than those to be mentioned below can comply with the first embodiment. Alternatively, this embodiment may take over the second embodiment and/or the third embodiment.

Figure 8:
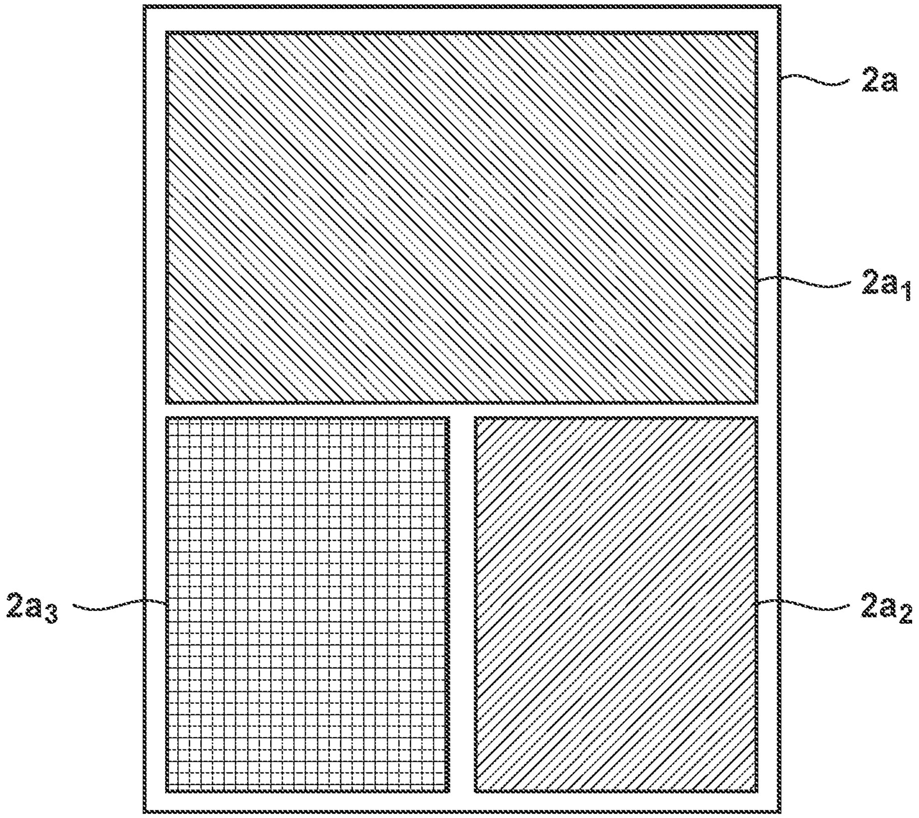
FIG. 8 is a view showing an example of the arrangement of a pattern region of a mold.

As shown in FIG. 8, a pattern region 2*a* where a pattern having concave and convex portions is formed in a mold 2 may be provided with a plurality of partial regions 2*a*1 to 2*a*3 including different pattern arrangements for forming an imprint material 3 on a substrate. The pattern arrangement can include, for example, the presence/absence of a pattern having concave and convex portions, the density of the concave portion in the pattern having concave and convex portions, the depth of the concave portion, and/or the width of the concave portion. In this case, in the plurality of partial regions in the mold 2, optimum pitch ratios Y/X are different from each other. Therefore, an arrangement recipe may be determined for each partial region in the mold 2 by performing the determination method described in the first to third embodiments. Alternatively, a combination of arrangement recipes each formed from the optimum pitch ratio Y/X and the smallest droplet volume with respect to a target residual layer thickness may be determined as an optimum arrangement recipe for each region.

<Embodiment of Article Manufacturing Method>

An article manufacturing method according to an embodiment of the present invention is suitable for manufacturing an article, for example, a microdevice such as a semiconductor device or an element having a fine structure. The article manufacturing method according to this embodiment includes a forming step of forming a composition on a substrate using the above-described forming method by a forming apparatus (imprint apparatus or planarization apparatus), a processing step of processing the substrate on which the composition has been formed, and a manufacturing step of manufacturing an article from the processed substrate. The manufacturing method also includes other known steps (for example, oxidation, deposition, vapor deposition, doping, planarization, etching, resist removal, dicing, bonding, and packaging). The article manufacturing method according to this embodiment is advantageous in at least one of the performance, quality, productivity, and production cost of the article, as compared to conventional methods.

The pattern of a cured product formed using the forming apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 9A:
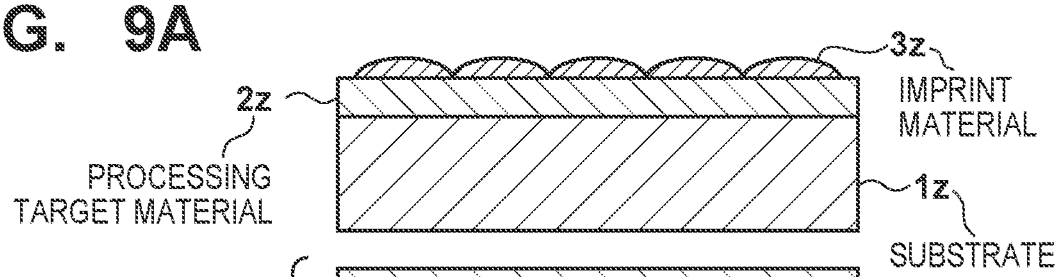
FIGS. 9A to 9F are views for explaining an article manufacturing method.

A practical article manufacturing method in a case where an imprint apparatus is used as a forming apparatus will be described next. As shown FIG. 9A, a substrate 1*z* such as a silicon wafer with a processed material 2*z* such as an insulator formed on the surface is prepared. Next, an imprint material 3*z* is applied to the surface of the processed material 2*z* by an inkjet method or the like. A state in which the imprint material 3*z* is applied as a plurality of droplets onto the substrate is shown here.

Figure 9B:
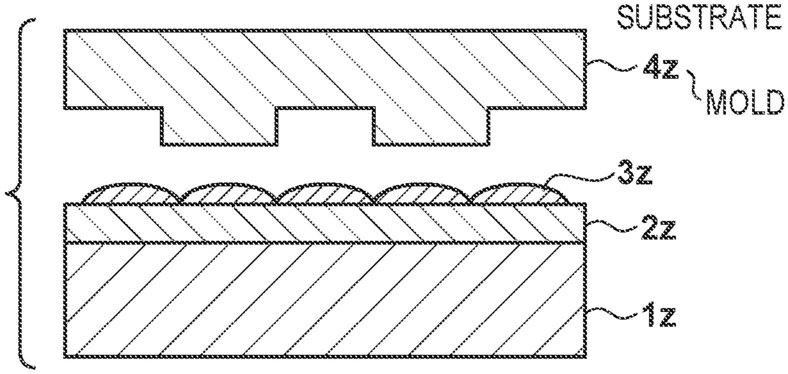
Figure 9C:
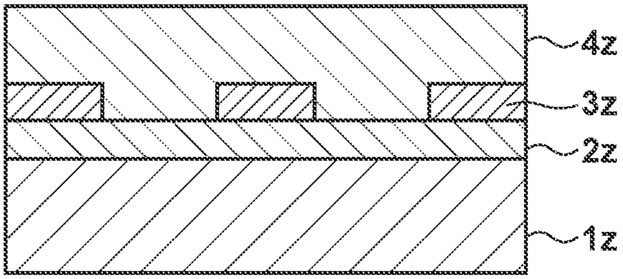

As shown in FIG. 9B, a side of a mold 4*z* for imprint with a pattern having concave and convex portions is directed to face the imprint material 3*z* on the substrate. As shown FIG. 9C, the mold 4*z* and the substrate 1*z* to which the imprint material 3*z* has been applied are brought into contact with each other, and a pressure is applied. The gap between the mold 4*z* and the processed material 2*z* is filled with the imprint material 3*z*. In this state, when the imprint material 3*z* is irradiated with light as curing energy via the mold 4*z*, the imprint material 3*z* is cured.

Figure 9D:
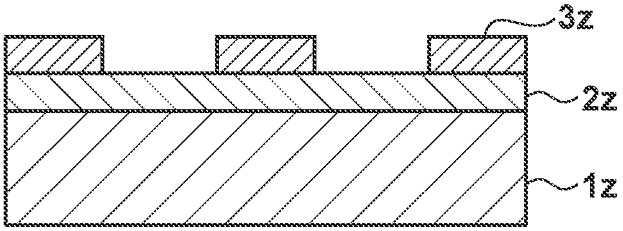

As shown in FIG. 9D, after the imprint material 3*z* is cured, the mold 4*z* is separated from the substrate 1*z*, and the pattern of the cured product of the imprint material 3*z* is formed on the substrate 1*z*. In the pattern of the cured product, the concave portion of the mold corresponds to the convex portion of the cured product, and the convex portion of the mold corresponds to the concave portion of the cured product. That is, the pattern having concave and convex portions of the mold 4*z* is transferred to the imprint material 3*z*.

Figure 9E:
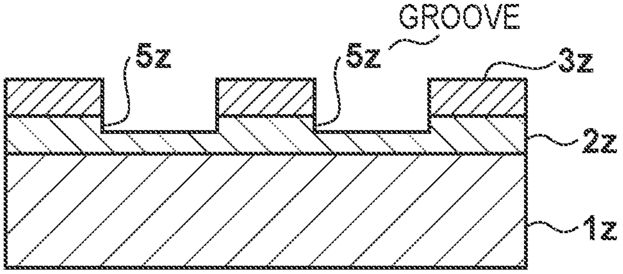
Figure 9F:
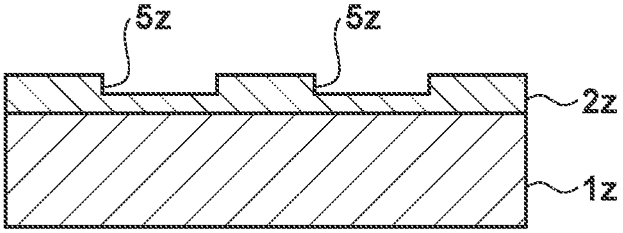

As shown in FIG. 9E, when etching is performed using the pattern of the cured product as an etching resistant mask, a portion of the surface of the processed material 2*z* where the cured product does not exist or remains thin is removed to form a groove 5*z*. As shown in FIG. 9F, when the pattern of the cured product is removed, an article with the grooves 5*z* formed in the surface of the processed material 2*z* can be obtained. Here, the pattern of the cured product is removed. However, instead of removing the pattern of the cured product after the process, it may be used as, for example, an interlayer dielectric film included in a semiconductor element or the like, that is, a constituent member of an article.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-185751 filed on Nov. 21, 2022, which is hereby incorporated by reference herein in its entirety.

What is claimed is:

1. A determination method of determining a recipe for arranging a composition as a plurality of droplets on a substrate in a forming process of forming the composition on the substrate using a mold, comprising:

setting a grid for defining a first pitch as a pitch in a first direction between the droplets and a second pitch as a pitch in a second direction between the droplets, the second direction intersecting the first direction; and determining the recipe based on the grid, wherein the grid is set, based on information representing a relationship between a pitch ratio as a ratio of the first pitch and the second pitch and a number of defects occurring in the composition in the forming process, so that the number of defects is smaller than a predetermined value.

2. The method according to claim 1, wherein the grid is set so that a volume of each droplet for making the composition formed by the forming process have a target film thickness is reduced while the number of defects is smaller than the predetermined value.

3. The method according to claim 1, wherein the setting the grid includes creating a plurality of candidate grids based on the relationship so that the number of defects is smaller than the predetermined value, determining, for each of the plurality of candidate grids, a volume of each droplet for making the composition formed by the forming process have a target film thickness, and setting, as the grid, a candidate grid selected from the plurality of candidate grids in accordance with the volume.

4. The method according to claim 3, wherein a candidate grid with the smallest volume among the plurality of candidate grids is set as the grid.

5. The method according to claim 3, wherein in the forming process, the composition is arranged on the substrate by controlling discharge of a droplet of the composition from each of a plurality discharge outlets arranged in the first direction, while scanning the substrate in the second direction with respect to the plurality of discharge outlets, and the plurality of candidate grids are created by calculating an integer multiple of a pitch between the plurality of discharge outlets.

6. The method according to claim 3, wherein in the forming process, the composition is arranged on the substrate by controlling discharge of a droplet of the composition from each of a plurality discharge outlets arranged in the first direction, while scanning the substrate in the second direction with respect to the plurality of discharge outlets, and a plurality of provisional grids are created by calculating an integer multiple of a pitch between the plurality of discharge outlets, and the plurality of candidate grids are created by adjusting a magnification in the second direction so that the pitch ratio becomes closer to a target ratio for each of the plurality of provisional grids.

7. The method according to claim 6, wherein the magnification in the second direction defines a scanning speed of the substrate while the composition is arranged on the substrate, and the plurality of candidate grids are created by adjusting the magnification in the second direction so that the scanning speed falls within a first limiting range for each of the plurality of provisional grids.

8. The method according to claim 6, wherein the magnification in the second direction defines a droplet discharge frequency from each discharge outlet while the composition is arranged on the substrate, and the plurality of candidate grids are created by adjusting the magnification in the second direction so that the discharge frequency falls within a second limiting range for each of the plurality of provisional grids.

9. The method according to claim 6, wherein the target ratio is selected from a range of the pitch ratio within which the number of defects is smaller than the predetermined value in the relationship.

10. The method according to claim 6, wherein the target ratio is set so that the number of defects is smallest based on the relationship.

11. The method according to claim 1, wherein the mold includes a plurality of regions including different pattern arrangements for forming the composition on the substrate, and the setting the grid and the determining the recipe are executed for each of the plurality of regions.

12. A forming method of forming a composition on a substrate using a mold, comprising:

determining a recipe for arranging the composition as a plurality of droplets on the substrate using a determination method defined in claim 1;

arranging the composition on the substrate in accordance with the determined recipe; and forming the composition on the substrate by bringing the mold into contact with the composition arranged on the substrate.

13. An article manufacturing method comprising:

forming a composition on a substrate using the forming method defined in claim 12;

processing the substrate on which the composition has been formed in the forming the composition; and manufacturing an article from the substrate processed in the processing the substrate.

14. A non-transitory computer-readable storage medium storing a program for causing a computer to execute a determination method according to claim 1.

15. An information processing apparatus for determining a recipe for arranging a composition as a plurality of droplets on a substrate in a forming process of forming the composition on the substrate using a mold, the information processing apparatus comprising:

a processor and a memory, the processor being configured to execute:

setting a grid for defining a first pitch as a pitch in a first direction between the droplets and a second pitch as a pitch in a second direction between the droplets, the second direction intersecting the first direction; and determining the recipe based on the grid, wherein the grid is set, based on information representing a relationship between a pitch ratio as a ratio of the first pitch and the second pitch and a number of defects occurring in the composition in the forming process, so that the number of defects is smaller than a predetermined value.

16. A forming apparatus for performing a forming process of forming a composition on a substrate using a mold, comprising:

an information processing apparatus defined in claim 15 and configured to determine a recipe for arranging the composition as a plurality of droplets on the substrate in the forming process;

a discharger configured to discharge the composition as the plurality of droplets onto the substrate; and a controller configured to control the forming process, wherein the controller controls a process of arranging the composition as the plurality of droplets on the substrate by the discharger in accordance with the recipe determined by the information processing apparatus.

* * * * *